(12) United States Patent
Lee et al.

(10) Patent No.: US 6,643,191 B2
(45) Date of Patent: Nov. 4, 2003

(54) SEMICONDUCTOR DEVICE HAVING CHIP SELECTION CIRCUIT AND METHOD OF GENERATING CHIP SELECTION SIGNAL

(75) Inventors: Yun-sang Lee, Kyungki-do (KR); Jong-hyun Choi, Kyungki-do (KR); Sang-seok Kang, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/102,308

(22) Filed: Mar. 19, 2002

(65) Prior Publication Data

US 2002/0141247 A1 Oct. 3, 2002

(30) Foreign Application Priority Data

Mar. 27, 2001 (KR) .................................. 10-2001-16017

(51) Int. Cl.[7] ................................................. G11C 7/00
(52) U.S. Cl. ........................... 365/189.05; 365/189.09; 365/230.05
(58) Field of Search ....................... 365/189.05, 230.05, 365/189.09, 203, 230.06, 230.08

(56) References Cited

U.S. PATENT DOCUMENTS 5,384,745 A * 1/1995 Konishi et al. ........ 365/203.03
5,886,946 A * 3/1999 Ooishi ........................ 365/233
6,456,563 B1 * 9/2002 Kajimoto .................... 365/233

* cited by examiner

*Primary Examiner*—David Nelms
*Assistant Examiner*—Gene N. Auduong
(74) *Attorney, Agent, or Firm*—Marger Johnson & McCollom, P.C.

(57) ABSTRACT

A semiconductor memory device and a method of generating a chip selection signal that enable the analysis of the causes of defects of defective memory devices selected by a user from a system with a plurality of memory devices and the fixing the defects are provided. The semiconductor memory device includes a programming register, an input buffer control circuit, and a chip selection circuit. The programming register activates an output signal in response to an address and a command input from the outside. The input buffer control circuit activates the plurality of data input buffer circuits in response to the output signal of the programming register. The chip selection circuit activates a defect detecting & repairing circuit, such as a repair circuit or a test time shortening circuit, when at least one of output signals of the plurality of data input buffer circuits is in a first logic state.

14 Claims, 4 Drawing Sheets

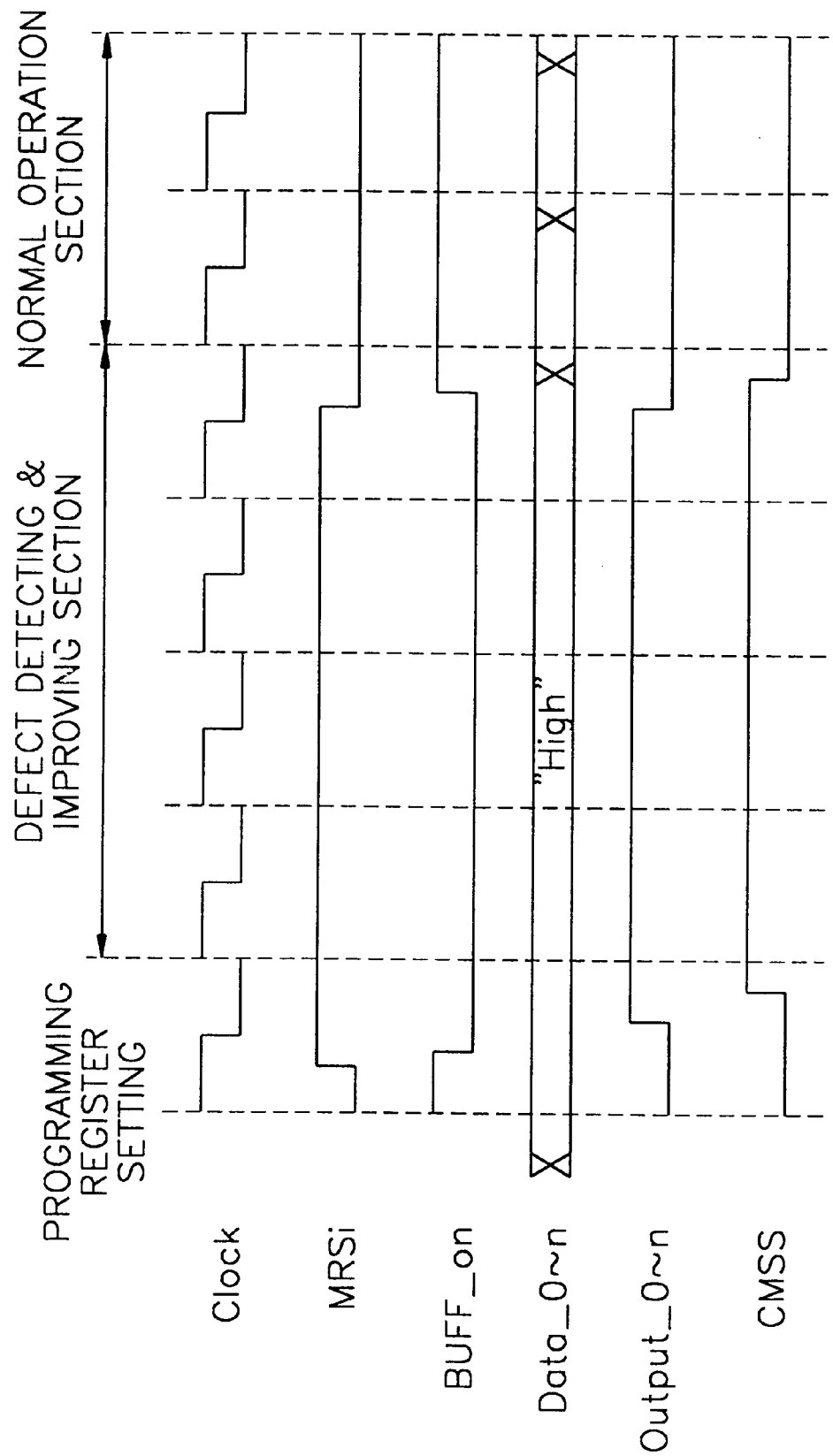

SEMICONDUCTOR DEVICE HAVING CHIP SELECTION CIRCUIT AND METHOD OF GENERATING CHIP SELECTION SIGNAL

BACKGROUND OF THE INVENTION

1. Field of the Invention

The present invention relates to a semiconductor memory device, and more particularly, to a semiconductor memory device having a chip selection circuit and a method of generating a chip selection signal.

2. Description of the Related Art

A variety of electronic systems, such as multimedia devices, that are commonly used need many memory devices in order to process a large amount of data. In general, tens through millions of memory devices are installed in one system. Thus, of all the causes of defects generated in a system, defects due to memory devices have increased.

However, it is not easy to detect and repair defects generated due to memory devices in a system having many memory devices. Also, even if memory devices generating defects are detected, the system must stop operating to fix the defects.

SUMMARY OF THE INVENTION

To solve the above-described problems, it is a first object of the present invention to provide a semiconductor memory device having a scheme which enables the analysis of the causes of defects of a particular defective memory device selected by a user from a system with many memory devices and the fixing of the defects.

It is a second object of the present invention to provide a method of generating a chip selection signal which enables the analysis of the causes of defects of a defective memory device selected by a user from a system with many memory devices and the fixing of the defects.

Accordingly, to achieve the first object, there is provided a semiconductor memory device having a plurality of data input buffer circuits. The semiconductor memory device includes: a programming register for activating an output signal in response to an address and a command input from the outside; an input buffer control circuit for activating the plurality of data input buffer circuits in response to the output signal of the programming register; and a chip selection circuit for activating a predetermined circuit when at least one of output signals of the plurality of data input buffer circuits is in a first logic state. The predetermined circuit is a defect detecting & repairing circuit such as a repair circuit or a test time shortening circuit. The input buffer control circuit activates the plurality of data input buffer circuits in response to a control signal which informs a normal operation section of the semiconductor memory device that the semiconductor memory device is in a state of normal operation. The input buffer control circuit comprises a NOR gate for receiving the output signal of the programming register and the control signal informing that the semiconductor memory device is operating normally, generating an output signal, and applying the output signal and the control signal to the plurality of data input buffer circuits. The chip selection circuit comprises a NOR gate for receiving output signals of the plurality of data input buffer circuits, generating an output signal, and applying the output signal to the predetermined circuit.

To achieve the second object, there is provided a method of generating a chip selection signal for activating a predetermined circuit in a semiconductor memory device having a plurality of data input buffer circuits. In the method, a first control signal is generated in response to an address and a command input from outside the semiconductor memory device. A second control signal for activating the plurality of data input buffer circuits is generated in response to the first control signal. A chip selection signal for activating the predetermined circuit is generated when at least one of output signals of the plurality of data input buffer circuits is in a first logic state. The predetermined circuit is a defect detecting & repairing circuit such as a repair circuit or a test time shortening circuit.

BRIEF DESCRIPTION OF THE DRAWINGS

The above objects and advantages of the present invention will become more apparent by describing in detail a preferred embodiment thereof with reference to the attached drawings in which:

FIG. 5 is a timing diagram of an embodiment of the operation of a semiconductor memory device in accordance with the present invention.

DETAILED DESCRIPTION OF THE INVENTION

Figure 1:
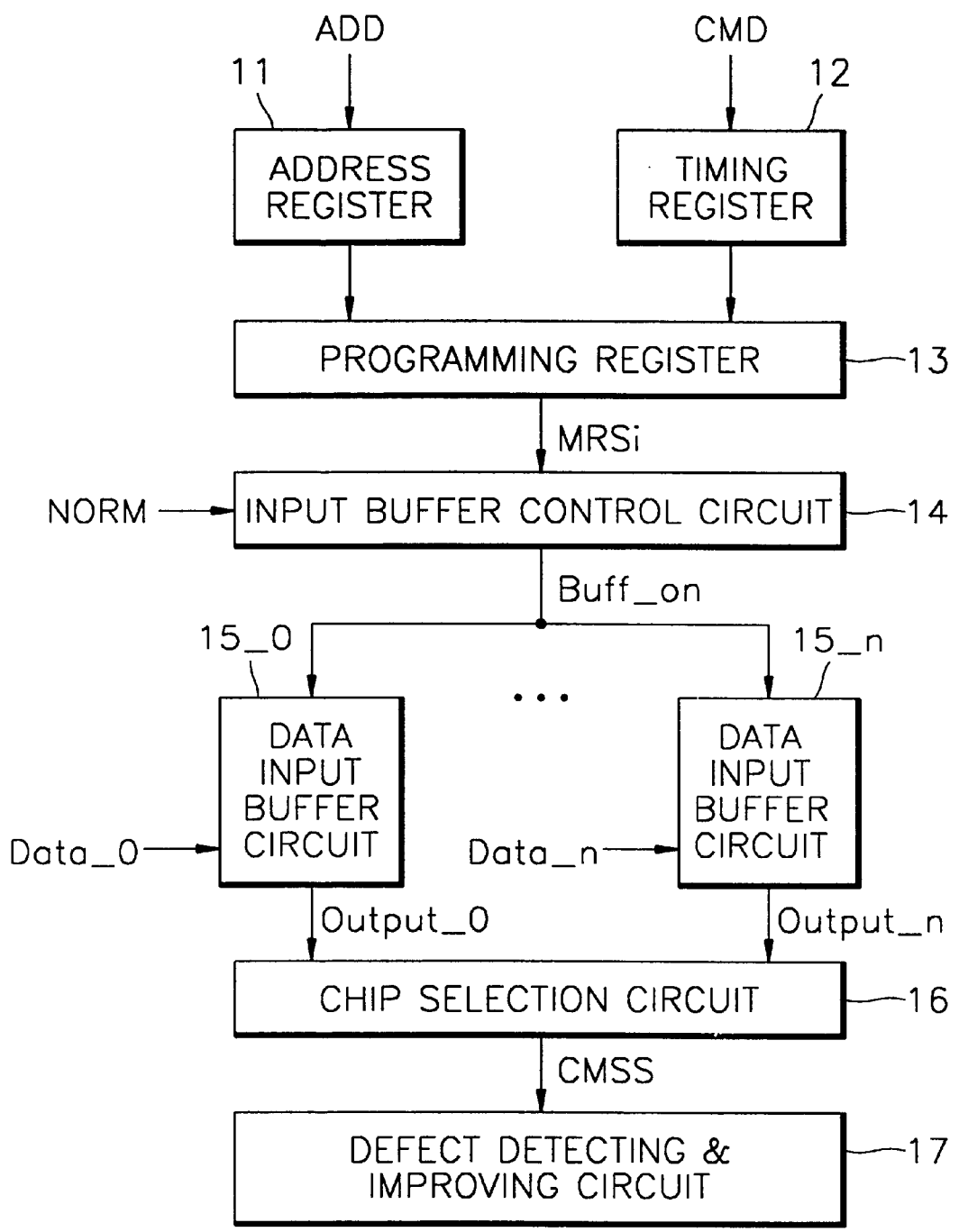
FIG. 1 is a block diagram of an embodiment of a semiconductor memory device according to an embodiment of the present invention.

Attached drawings for illustrating a preferred embodiment of the present invention and the contents written on the attached drawings must be referred to in order to gain a sufficient understanding of the merits of the present invention and the operation thereof and the objectives accomplished by the operation of the present invention.

Hereinafter, an embodiment of the present invention will be described in detail with reference to the attached drawings. Like reference numerals in the drawings denote the same members.

FIG. 1 is a block diagram of a semiconductor memory device according to an embodiment of the present invention. Referring to FIG. 1, the semiconductor memory device includes an address register 11, a timing register 12, a programming register 13, an input buffer control circuit 14, a plurality of data input buffer circuits 15_0 through 15_$n$, a chip selection circuit 16, and a defect detecting & repairing circuit 17.

The address register 11 receives an address ADD input from the outside and then outputs the address ADD to the programming register 13. The timing register 12 receives a command CMD input from the outside and then outputs the command CMD to the programming register 13.

The programming register 13 activates an output signal MRSi in response to the address ADD output from the address register 11 and the command CMD output from the timing register 12. A mode register, which is generally used in a semiconductor memory device, may be used for the programming register 13.

The input buffer control circuit 14 activates an output signal Buff_on and then transmits the output signal Buff-on to each of the data input buffer circuits 15_0 through 15_n in response to the output signal MRSi of the programming register 13. The chip selection circuit 16 activates a chip selection signal CMSS to activate the defect detecting & repairing circuit 17 when at least one of data DATA_0 through DATA_n input from the outside via the data input buffer circuits 15_0 through 15_n, which are activated, is in a first logic state, i.e., at least one of output signals Output 0 through Output n of the data input buffer circuit 15_0 through 15_n is in a first logic state.

The defect detecting & repairing circuit 17 may be a repair circuit, a test time shortening circuit, or a circuit for detecting or repairing various characteristics of the semiconductor memory device.

The input buffer control circuit 14 activates the output signal Buff_on in order to activate the data input buffer circuits 15_0 through 15_n in response to a control signal NORM which informs a normal operation section of the semiconductor memory device that the semiconductor memory device is in a state of normal operation.

Figure 2:
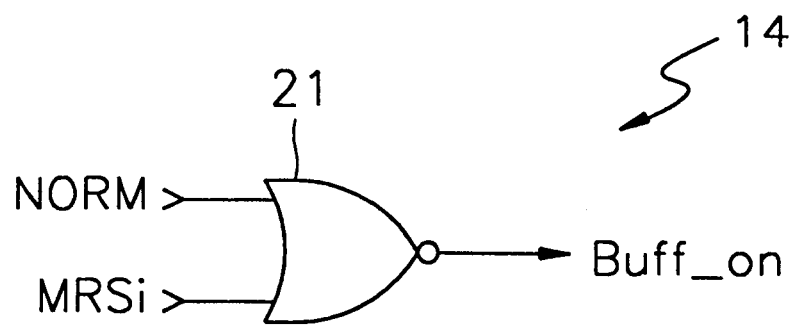
FIG. 2 is an embodiment of a circuit diagram of an input buffer control circuit.

FIG. 2 is a circuit diagram of an embodiment of the input buffer control circuit shown in FIG. 1. Referring to FIG. 2, the input buffer control circuit 14 includes a NOR gate 21. The NOR gate 21 generates an output signal Buff_on in response to the output signal MRSi of the programming register 13 and the control signal NORM informing that the semiconductor memory device is operating normally. If any one of the output signal MRSi of the programming register 13 and the control signal NORM is set to the first logic state, i.e., "high", the output signal Buff_on is set to a second logic state, i.e., "low", thereby activating the data input buffer circuits 15_0 through 15_n shown in FIG. 1.

Figure 3:
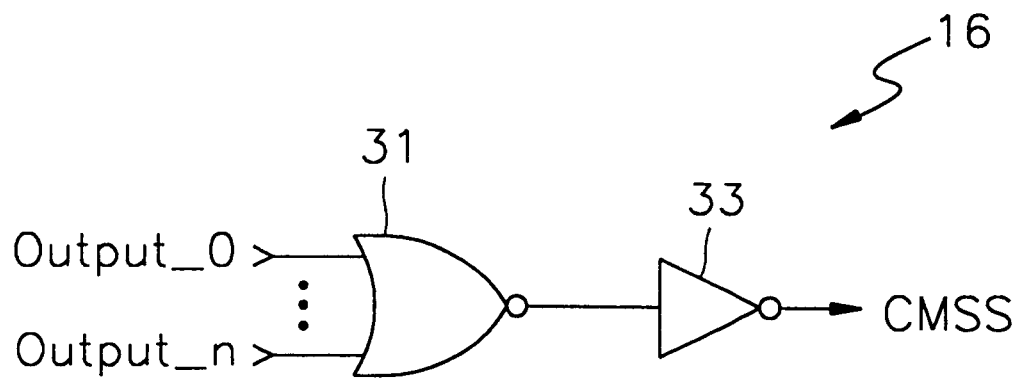
FIG. 3 is an embodiment of a circuit diagram of a chip selection circuit.

FIG. 3 is a circuit diagram of an embodiment of the chip selection circuit shown in FIG. 1. Referring to FIG. 3, the chip selection circuit 16 includes a NOR gate 31 and an inverter 33, the combination of which performs the operation of an OR gate. The NOR gate 31 receives the output signals Output_0 through Output_n of the data input buffer circuits 15_0 through 15_n shown in FIG. 1, and the inverter 33 inverts a signal output from the NOR gate 31 into a chip selection signal CMSS.

Accordingly, if at least one of the output signals Output 0 through Output n of the data input buffer circuits 15_0 through 15_n is in the first logic state, i.e., "high", the chip selection signal CMSS is set to logic "high", thereby activating the defect detecting & repairing circuit 17 shown in FIG. 1.

Figure 4:
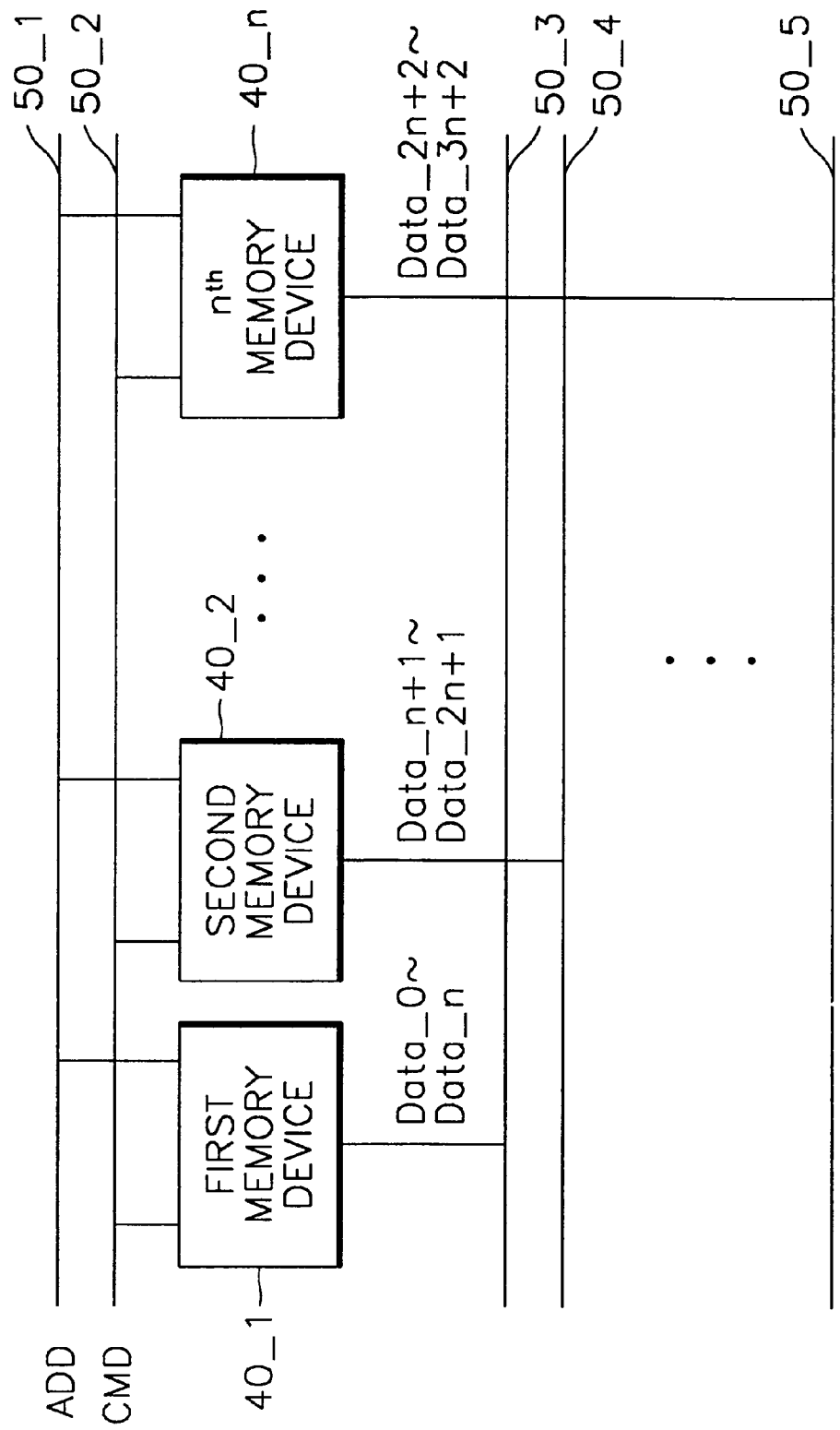
FIG. 4 is a diagram of an embodiment of a system with semiconductor memory devices according to the present invention.

FIG. 4 is a diagram of a system with semiconductor memory devices according to the present invention shown in FIG. 1. Referring to FIG. 4, a plurality of memory devices 40-1 through 40-n share an address bus line 50-1 for transmitting the address ADD and a command bus line 50-2 for transmitting the command CMD. Data bus lines 50-3 through 50-n for transmitting data Data_0 through Data_3n+2 are assigned to each of the memory devices 40-1 through 40-n. That is, the first memory device 40-1 is assigned to data bus line 50-3 for transmitting data Data_0 through Data_n, the second memory device 40-2 is assigned to data bus line 50-4 for transmitting data Data_n+1 through Data_2n+1, and the nth memory device 40-n is assigned to data bus line 50-n for transmitting data Data_2n+2 through Data_3n+2.

FIG. 5 is a timing diagram of an embodiment of the operation of the semiconductor memory device according to the present invention shown in FIG. 4. Hereinafter, the operation of the semiconductor memory device according to the present invention shown in FIG. 1 and a method of generating a chip selection signal will be described with reference to the system shown in FIG. 4 and the timing diagram shown in FIG. 5.

It is assumed that defects are generated in the first memory device 40-1 in the system shown in FIG. 4. If an address ADD for the first memory device 40-1 is input into the first memory device 40-1 via the address bus line 50-1 and a command CMD for setting the programming register 13 in the first memory device 40-1 is input into the first memory device via the command bus line 50-2, the output signal MRSi of the programming register 13 in the first memory device 40-1 is activated to logic "high". Thus, the output signal Buff_on of the input buffer control circuit 14 is activated to logic "low" to activate all the data input buffer circuits 15_0 through 15_n. Here, if at least one of the data Data_0 through Data_n, which are input into the first memory device 40-1 via the data bus line 50-3, is logic "high" (i.e., at least one of the output signals Output 0 through Output n of the data input buffer circuits 15_0 through 15_n is logic "high"), the chip selection signal CMSS is activated to logic "high". When the chip selection signal CMSS of the first memory device 40-1 is activated to logic "high", the defect detecting & repairing circuit 17 is activated. Accordingly, a system user activates the defect detecting & repairing circuit 17 in the first memory device 40-1 having defects to analyse the causes of the defects and fix the defects. As described above, in the semiconductor memory device according to the present invention and the method of generating the chip selection signal, a system user can select only defective memory devices from a system with many memory devices to analyse the causes of the defects and fix the defects.

Although a preferred embodiment of the present invention has been described with reference to the drawings, the scope of the present invention must not be interpreted as being restricted to the embodiment. The embodiment is provided to more completely explain the present invention to those skilled in the art. Thus, it will be apparent to one of ordinary skill in the art that modifications to the described embodiment may be made without departing from the spirit and scope of the invention. Consequently, the range of technical protection of the present invention should be determined by the appended claims.

What is claimed is:

1. A semiconductor memory device having a plurality of data input buffer circuits, the semiconductor memory device comprising:

a programming register to activate an output signal in response to an address and a command input from the outside;

an input buffer control circuit to activate the plurality of data input buffer circuits in response to the output signal of the programming register; and a chip selection circuit to receive outputs from the data input buffers and to activate a predetermined circuit when at least one of output signals of the plurality of data input buffer circuits is in a first logic state.

2. The semiconductor memory device of claim 1, wherein the predetermined circuit is a defect detecting and repairing circuit operable to act as one of the group comprised of: a repair circuit, a test time shortening circuit, a circuit for detecting characteristics of the semiconductor memory device, and a circuit for repairing characteristics of the semiconductor memory device.

3. The semiconductor memory device of claim 1, wherein the input buffer control circuit activates the plurality of data input buffer circuits in response to a control signal indicating normal operation of the semiconductor memory device.

4. The semiconductor memory device of claim 1, wherein the first logic state is logic "high".

5. The semiconductor memory device of claim 1, wherein the input buffer control circuit comprises a NOR gate to receive the output signal of the programming register and a control signal indicating normal operation of the semiconductor memory device, to generate an output signal, and to apply the output signal to the plurality of data input buffer circuits.

6. The semiconductor memory device of claim 1, wherein the chip selection circuit comprises a NOR gate to receive output signals of the plurality of data input buffer circuits, to generate an output signal, and to apply the output signal to the predetermined circuit.

7. A method of generating a chip selection signal to activate a predetermined circuit in a semiconductor memory device having a plurality of data input buffer circuits, the method comprising:
   generating a first control signal in response to an address and a command input from outside the semiconductor memory device;
   generating a second control signal to activate the plurality of data input buffer circuits in response to the first control signal; and
   generating a chip selection signal to activate the predetermined circuit when at least one of output signals of the plurality of data input buffer circuits is in a first logic state.

8. The method of claim 7, wherein generating a chip selection signal to activate the predetermined circuit further comprises generating a chip selection signal to activate a defect detecting & repairing circuit.

9. The method of claim 7, wherein the first logic state is logic "high".

10. A semiconductor memory device comprising:
    a programming register to generate an output signal in response to at least one input; an input buffer control circuit to generate a buffer activation signal in response to the output signal of the programming register;
    a plurality of data input buffer circuits to receive the buffer activation signal, which selects at least one of the data input buffer circuits to generate a buffer output signal;
    a chip selection circuit to receive the buffer output signal and to activate a defect detecting and repair circuit when at least one of the buffer output signals is in a first logic state.

11. The semiconductor memory device of claim 10, wherein the input buffer control circuit generates the buffer activation signal in response to a control signal indicating normal operation of the semiconductor memory device.

12. The semiconductor memory device of claim 10, wherein the first logic state is logic "high".

13. The semiconductor memory device of claim 10, wherein the input buffer control circuit comprises a NOR gate to:
    receive the output signal and a control signal indicating normal operation of the semiconductor memory device;
    generate a buffer activation signal; and
    apply the buffer activation signal to the plurality of data input buffer circuits.

14. The semiconductor memory device of claim 10, wherein the chip selection circuit comprises a NOR gate to receive buffer output signals;
    generate a chip selection output signal; and
    apply the chip selection output signal to the predetermined circuit.

* * * * *